(12) United States Patent
Yano et al.

(10) Patent No.: US 7,998,372 B2
(45) Date of Patent: Aug. 16, 2011

(54) SEMICONDUCTOR THIN FILM, METHOD FOR MANUFACTURING THE SAME, THIN FILM TRANSISTOR, AND ACTIVE-MATRIX-DRIVEN DISPLAY PANEL

(75) Inventors: Koki Yano, Sodegaura (JP); Kazuyoshi Inoue, Sodegaura (JP); Nobuo Tanaka, Sodegaura (JP); Tokie Tanaka, legal representative, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 35 days.

(21) Appl. No.: 12/094,228

(22) PCT Filed: Nov. 16, 2006

(86) PCT No.: PCT/JP2006/322808
§ 371 (c)(1),
(2), (4) Date: Mar. 19, 2010

(87) PCT Pub. No.: WO2007/058231
PCT Pub. Date: May 24, 2007

(65) Prior Publication Data
US 2010/0163860 A1     Jul. 1, 2010

(30) Foreign Application Priority Data

Nov. 18, 2005  (JP) ................................. 2005-334501

(51) Int. Cl.
*H01B 1/08* (2006.01)
*H01L 29/12* (2006.01)

(52) U.S. Cl. ............. 252/519.51; 252/520.1; 252/519.1; 252/519.33; 257/43; 257/57; 257/59; 257/E29.08; 257/E21.459; 438/104; 977/773

(58) Field of Classification Search ............. 252/519.51, 252/520.1, 519.1, 519.33; 257/43, 57, 59, 257/E29.08, E21.459; 438/104; 977/773
See application file for complete search history.

(56) References Cited

U.S. PATENT DOCUMENTS

| 6,669,830 | B1 | 12/2003 | Inoue et al. | |
|---|---|---|---|---|
| 2003/0037843 | A1 | 2/2003 | Hishida | |
| 2008/0017854 | A1* | 1/2008 | Marks et al. | 257/43 |
| 2009/0090914 | A1* | 4/2009 | Yano et al. | 257/66 |
| 2010/0051938 | A1* | 3/2010 | Hayashi et al. | 257/43 |
| 2010/0140599 | A1* | 6/2010 | Yano et al. | 257/40 |
| 2010/0140609 | A1* | 6/2010 | Yano et al. | 257/43 |
| 2010/0155717 | A1* | 6/2010 | Yano et al. | 257/43 |

FOREIGN PATENT DOCUMENTS

| CN | 1379827 | 11/2002 |
|---|---|---|
| JP | 2003-016858 A | 1/2003 |
| JP | 2003016858 A | 1/2003 |
| JP | 2003-086808 A | 3/2003 |
| JP | 2003-100152 A | 4/2003 |
| JP | 2004-273614 A | 9/2004 |
| WO | WO-2004 034449 | 4/2004 |
| WO | WO 2004105054 A1 * | 12/2004 |
| WO | PCT/JP2006/322808 R | 2/2007 |

OTHER PUBLICATIONS

International Search Report completed Feb. 8, 2007 for International Patent Application No. PCT/JP2006/322808 filed Nov. 16, 2006.
Akihiro Takagi et al., "Carrier Transport and Electronic Structure in Amorphous Oxide Semiconductor, a-InGaZnO4," Thin Solid Films, Aug. 2005, vol. 486 Nos. 1-2, pp. 38-41.
Matthew P. Taylor et al., "The Electrical, Optical, and Structural Properties of InxZn1-xOy(0<x<1) Thin Films by Combinatorial Techniques," Meas. Sci. Technol., Jan. 2005, vol. 16 No. 1, pp. 90-94.
Takagi, A. et al. "Carrier Transport and Electronic Structure in Amorphous Oxide Semiconductor, A-InGaZn04," Thin Solid Films, Aug. 2005, pp. 38-41, vol. 486 Nos. 1-2.
Taylor, M.P. et al. "The Electrical, Optical and Structural Properties of InxZn1-xOy Thin Films by Combinatorial Techniques," Meas. Sci. Technol., Jan. 2005, vol. 16 No. 1, pp. 90-94.
Office Action for Chinese Patent Application No. 200680042998 issued Jun. 29, 2010.
English Translation of Office Action for Chinese Patent Application No. 200680042998 issued Jun. 29, 2010.

* cited by examiner

*Primary Examiner* — Douglas McGinty
(74) *Attorney, Agent, or Firm* — Millen, White, Zelano & Branigan, P.C.

(57) ABSTRACT

Disclosed is a semiconductor thin film which can be formed at a relatively low temperature even on a flexible resin substrate. Since the semiconductor thin film is stable to visible light and has high device characteristics such as transistor characteristics, in the case where the semiconductor thin film is used as a switching device for driving a display, even when overlapped with a pixel part, the luminance of a display panel does not deteriorate. Specifically, a transparent semiconductor thin film 40 is produced by forming an amorphous film containing zinc oxide and indium oxide and then oxidizing the film so that the resulting film has a carrier density of $10^{+17}$ $cm^{-3}$ or less, a Hall mobility of 2 $cm^2/V \cdot sec$ or higher, and an energy band gap of 2.4 EV or more.

18 Claims, 1 Drawing Sheet

SEMICONDUCTOR THIN FILM, METHOD FOR MANUFACTURING THE SAME, THIN FILM TRANSISTOR, AND ACTIVE-MATRIX-DRIVEN DISPLAY PANEL

TECHNICAL FIELD

The present invention relates to a semiconductor thin film made by an amorphous film containing zinc oxide and indium oxide, a method of manufacturing the same, a thin film transistor using the semiconductor thin film, and an active-matrix-driven display panel to which such a thin film transistor is applied.

BACKGROUND ART

A field effect transistor is widely used as a unit electronic device of a semiconductor memory integrated circuit, a high-frequency signal amplification device, a liquid crystal drive device, or the like and is an electronic device which is most practically used at present.

Among the devices, with remarkable development of displays in recent years, a thin film transistor (TFT) is often used as a switching device for driving a display by applying a drive voltage to a display device in not only a liquid crystal display (LCD) but also various displays such as an electroluminescence display (EL) and a field emission display (FED).

As the material of the thin film transistor, a silicon semiconductor compound is used most widely. Generally, silicon single crystal is used for an RF amplification device, a device for an integrated circuit, and the like requiring high-speed operation. Amorphous silicon is used for a liquid crystal driving device or the like to address a demand for a larger area.

However, at the time of crystallizing a crystalline silicon thin film, a high temperature such as 800° C. or higher is necessary, so that it is difficult to form the crystalline silicon thin film on a glass substrate or an organic substrate. There are consequently problems such that a crystalline silicon thin film can be formed only on an expensive substrate having high heat resistance such as silicon wafer, quartz, or the like, and enormous energy and a number of processes are required for manufacture.

On the other hand, an amorphous silicon semiconductor (amorphous silicon) which can be formed at a relatively low temperature has a switching speed lower than that of a crystalline one. Therefore, when the amorphous silicon semiconductor is used as a switching device for driving a display, there is the case that the semiconductor cannot follow high speed display of a moving picture.

Further, when a semiconductor active layer is irradiated with a visible ray, it becomes conductive. There is the possibility such that a leak current is generated, and an erroneous operation is performed. A problem occurs such that the characteristics of the switching device deteriorate. There is known a method of providing a light shield layer for blocking the visible ray to address the problem. As the light shield layer, for example, a metal thin film is used.

However, when the light shield layer which is a metal thin film is provided, the number of processes increases and, in addition, floating potential is generated. It is consequently necessary to set the light shield layer to the ground level. In this case as well, a problem occurs such that parasitic capacitance is generated.

Since the visible ray transmittance is low, when the semiconductor layer lies off to an electrode part, the transmittance of a display part decreases, illumination efficiency of back light deteriorates, and the screen may become darker. Allowance of process precision is small, and it is a factor of high cost.

At present, as the switching device for driving the display, a device using a silicon semiconductor film is the mainstream for the reasons that various performances of silicon thin films such as high stability, high processibility, and high switching speed are excellent. Such silicon thin films are manufactured generally by chemical vapor deposition (CVD) method.

There is a conventional thin film transistor (TFT) having an inversely-staggered structure in which a gate electrode, a gate insulating layer, a semiconductor layer made of amorphous silicon hydride (a-Si:H) or the like, and source and drain electrodes are stacked on a substrate made of glass or the like. In the field of a large-area device such as an image sensor, the conventional thin film transistor is used as a drive device of a flat panel display or the like typified by a liquid crystal display of an active matrix type. In those uses, as the functions become higher also in a conventional device made of amorphous silicon, higher operation speed is in demand.

Under such circumstances, in recent years, attention is being paid to a transparent semiconductor thin film made of a metallic oxide such as zinc oxide, particularly, a transparent semiconductor thin film made of a zinc oxide crystal as a film having stability higher than that of the silicon semiconductor thin film (amorphous silicon).

For example, a method of constructing a thin film transistor by crystallizing a zinc oxide at high temperature is described in Patent Documents 1 and 2, or the like.

Patent document 1: Japanese Unexamined Patent Application Publication No. 2003-86808
Patent document 2: Japanese Unexamined Patent Application Publication No. 2004-273614

DISCLOSURE OF THE INVENTION

Problems to be solved by the invention

However, the semiconductor thin film using zinc oxide has a problem such that when fine crystallization control is not performed, the Hall mobility decreases, so that the field effect mobility drops, and the switching speed becomes low. To increase crystallinity, like a silicon thin film, a film has to be formed on a special substrate having high crystallinity and a process of high temperature of 500° C. or higher has to be performed. Consequently, it is difficult to perform the process uniformly in a large area, particularly, on a glass substrate, and to practically perform the process in a liquid crystal panel.

The present invention has been achieved in consideration of the circumstances. An object of the invention is to provide a semiconductor thin film which can be formed relatively at a low temperature even on a flexible resin substrate, the semiconductor thin film being stable to a visible ray, having high device characteristics such as transistor characteristics and, when used as a switching device for driving a display, which does not make the luminance of a display panel decrease even when it overlaps a pixel part, a method of manufacturing the semiconductor thin film, a thin film transistor using such a semiconductor thin film, having high field effect mobility and high on-off ratio, and having improved device characteristics by reducing the influence of a radiation beam due to occurrence of leak current, and an active-matrix-driven display panel to which the thin film transistor is applied.

Means for Solving the Problems

A semiconductor thin film according to the present invention for solving the problems is made by an amorphous film containing zinc oxide, and indium oxide and whose carrier density is $10^{+17}$ cm$^{-3}$ or less, Hall mobility is 2 cm$^2$/V·sec or higher, and energy band gap is 2.4 eV or more.

With such a configuration, the semiconductor thin film according to the invention can be easily produced in a wide temperature range and uniform properties are easily displayed in a large area. Consequently, the semiconductor thin film is suitable for uses such as a display panel.

In the semiconductor thin film of the invention, when the carrier density becomes higher than $10^{+17}$ cm$^{-3}$, at the time of constructing a device such as a thin film transistor 1, a leak current occurs, the device becomes normally on, or the on-off ratio becomes lower, so that excellent transistor performance may not be displayed.

When the Hall mobility is smaller than 2 cm$^2$/Vs, the field effect mobility of the thin film transistor 1 becomes low. In the case of using the device as a switching device for driving a display device, there is the possibility that, in a manner similar to amorphous silicon, switching speed is low and the device cannot follow high-speed display of a moving picture.

If the energy band gap is smaller than 2.4 eV, when a visible ray is irradiated, electrons in the valence band are excited, conductivity is displayed, and there is the possibility that a leak current is generated easily.

In the semiconductor thin film according to the invention, to form a uniform amorphous film on a large area and to prevent the film quality from becoming nonuniform, preferably, atom ratio between zinc [Zn] and indium [In] in the amorphous film is expressed as Zn/(Zn+In)=0.10 to 0.82. More preferably, atom ratio between zinc [Zn] and indium [In] in the amorphous film is expressed as Zn/(Zn+In)=0.51 to 0.80.

In the semiconductor thin film according to the invention, preferably, transmittance of wavelength of 550 nm is 75% or higher. With such a configuration, even when the semiconductor thin film lies off to a pixel electrode part, inconveniences such as deterioration in transmittance and luminance and a change in hue can be effectively avoided.

The semiconductor thin film according to the present invention is preferably a non-degenerate semiconductor thin film having a work function of 3.5 to 6.5 eV. By setting the work function in the range, deterioration in the characteristics of the transistor caused by occurrence of leak current, energy barrier, and the like can be effectively avoided. Further, when the semiconductor thin film is made of a degenerate semiconductor, there is the possibility that the carrier concentration cannot be controlled stably to be low. By using a non-degenerate semiconductor thin film as the semiconductor thin film of the invention, such inconveniences can be avoided effectively. The non-degenerate semiconductor thin film denotes a semiconductor thin film in which the carrier concentration changes depending on the temperature. Temperature dependency of the carrier concentration can be obtained by Hall measurement.

In the semiconductor thin film according to the invention, preferably, nanocrystals are dispersed in the amorphous film. When nanocrystals are dispersed in the amorphous film, it is preferable for the reasons that the Hall mobility improves, the field effect mobility becomes higher, and the transistor characteristics improve.

The semiconductor thin film according to the invention may contain a third metallic element [M] other than indium oxide and zinc oxide and a compound of the element without deteriorating the effects of the embodiment. In this case, atom ratio [M/(M+In)] between the third metallic element [M] and indium [In] is preferably 0 to 0.5. The atom ratio [M/(M+In)] between the third metallic element [M] and indium [In] is more preferably 0 to 0.3.

In the semiconductor thin film according to the invention, when a maximum value of a radial distribution function (RDF) obtained by X-ray scatter measurement in an atomic distance of 0.3 to 0.36 nm is A and a maximum value of the RDF in an atomic distance of 0.36 to 0.42 nm is B, preferably, relation A/B>0.8 is satisfied. It is assumed that the ratio (A/B) expresses a ratio between edge sharing and corner sharing of the bonding mode of indium-oxygen-indium, or a short-distance-order management ratio.

When the ratio is 0.8 or less, there is the possibility that the Hall mobility and the field effect mobility drops.

The present invention also provides a method for manufacturing a semiconductor thin film, wherein, at the time of manufacturing the semiconductor thin film as described above, an amorphous film containing zinc oxide and indium oxide is formed under condition that a partial pressure of water $H_2O$ in an atmospheric gas is $10^{-3}$ Pa or less.

With such a method, an inconvenience that the Hall mobility may drop can be effectively avoided.

Preferably, the method for manufacturing a semiconductor thin film according to the invention further includes a step of oxidizing the amorphous film physically formed at a substrate temperature of 200° C. or less. When the substrate temperature is higher than 200° C., even after the oxidizing process, the carrier concentration may not decrease. In the case of using a resin substrate, deformation or a change in dimensions may occur.

It is preferable to perform the oxidizing process such as thermal treatment and ozone process in the presence of oxygen onto the semiconductor thin film formed in the above-described range in order to stabilize the carrier density.

In the case of performing heat treatment, preferably, the temperature of the film surface in the heat treatment is higher than the substrate temperature at the time of film formation by 100 to 270° C. When the temperature difference is smaller than 100° C., there is no heat treatment effect. When it is higher than 270° C., there is the possibility that the substrate is deformed, the semiconductor thin film interface alters, and the semiconductor characteristics deteriorate. To avoid such inconveniences more effectively, the temperature of the film surface in the heat treatment is higher than the substrate temperature at the time of deposition by, preferably, 130 to 240° C. and, more preferably 160 to 210° C.

The thin film transistor according to the invention can be constructed by including the above-described semiconductor thin film. The semiconductor thin film can be provided on a resin substrate.

An active-matrix-driven display panel according to the present invention can be constructed by including the above-described thin film transistor.

EFFECTS OF THE INVENTION

As described above, the present invention can provide a semiconductor thin film as a component of an excellent field effect transistor which can be formed on a glass substrate, a resin substrate, or the like in a wide temperature range, which is stable to a visible ray and hardly erroneously operates, and in which leak current is small. The semiconductor thin film of the present invention can be formed at a relatively low temperature. Consequently, by forming the semiconductor thin film on a resin substrate, a flexible thin film transistor or the like can be also provided.

DESCRIPTION OF REFERENCE NUMERALS

Figure 1:
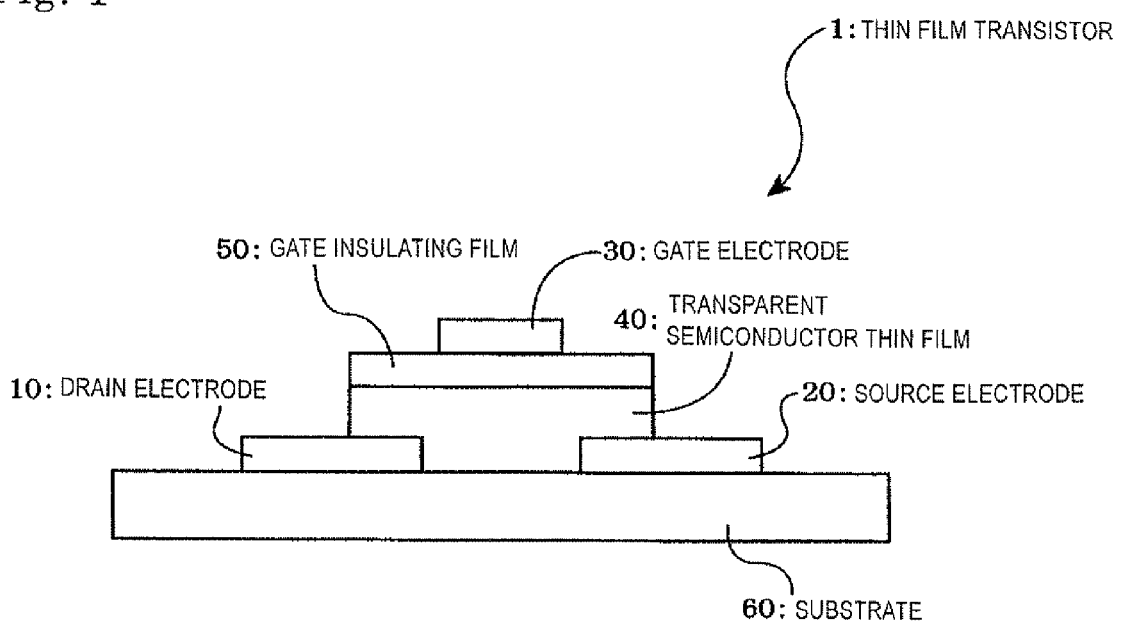
FIG. 1 is an explanatory diagram showing outline of an embodiment of a thin film transistor according to the invention.

1 thin film transistor
40 transparent semiconductor thin film

BEST MODE FOR CARRYING OUT THE INVENTION

Preferred embodiments of the present invention will be described below.

FIG. 1 is an explanatory diagram showing outline of an embodiment of a thin film transistor according to the invention.

In the example shown in the diagram, in a thin film transistor 1 as a field effect transistor, a drain electrode 10 and a source electrode 20 are formed so as to be apart from each other on a substrate 60, a transparent semiconductor thin film 40 is formed so as to be in contact with at least a part of each of the drain electrode 10 and the source electrode 20, and a gate insulating film 50 and a gate electrode 30 are formed in order on the transparent semiconductor thin film 40. In such a manner, the thin film transistor 1 is constructed as the thin film transistor 1 of a top gate type.

In the embodiment, as the substrate 60, a glass substrate or a resin substrate made of polyethylene terephthalate (PET), polycarbonate (PC), or the like can be used.

The materials of the gate electrode 30, the source electrode 20, and the drain electrode 10 are not particularly limited. Materials generally used can be arbitrarily selected without loosing the effects of the embodiment. For example, a transparent electrode of ITO, IZO, ZnO, SnO2, or the like, a metal electrode made of Al, Ag, Cr, Ni, Mo, Au, Ti, Ta, or the like, a metal electrode of any of the alloys containing the metals can be used.

Each of the gate electrode 30, the source electrode 20, and the drain electrode 10 may have a multilayer structure obtained by stacking two or more different conductive layers. In the example shown in the diagram, the electrodes 30, 20, and 10 are constructed by first conductive layers 31, 21, and 11 and second conductive layers 32, 22, and 12, respectively.

The material of the gate insulating film 50 is not also particularly limited. A material generally used can be arbitrarily selected without loosing the effects of the present invention of the embodiment. For example, an oxide such as $SiO_2$, $SiN_x$, $Al_2O_3$, $Ta_2O_5$, $TiO_2$, $MgO$, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, or the like can be used. Among the materials, preferably, $SiO_2$, $SiN_x$, $Al_2O_3$, $Y_2O_3$, $Hf_2O_3$, and $CaHfO_3$ are used. More preferably, $SiO_2$, $SiN_x$, $Y_2O_3$, $Hf_2O_3$, and $CaHfO_3$ are used. The particularly preferable materials are $SiO_2$ and $SiN_x$.

Such a gate insulating film 50 may have a structure in which two or more different insulating films are stacked. Although the gate insulating film 50 may be crystalline or amorphous, the amorphous material is preferable since it can be easily manufactured from the industrial viewpoint.

In the embodiment, the transparent semiconductor thin film 40 is made of an amorphous material containing zinc oxide and indium oxide and is formed so that a carrier density obtained by Hall measurement becomes $10^{+17}$ $cm^{-3}$ or less, a Hall mobility becomes 2 $cm^2/Vs$ or more, and an energy band gap between a conduction band and a valence band becomes 2.4 eV or more.

The amorphous film containing zinc oxide and indium oxide is easily produced in a wide temperature range and, by forming an amorphous film, a uniform property is easily expressed in a large area. Consequently, the amorphous film is particularly preferable for the use of a display panel or the like. For example, it can be suitably used for an active-matrix-driven display panel.

From no appearance of a clear peak in X-ray diffraction, it can be confirmed that the film is an amorphous film.

When the carrier density becomes higher than $10^{+17}$ $cm^{-3}$, at the time of constructing a device such as the thin film transistor 1, a leak current occurs, the device becomes normally on, or the on-off ratio becomes lower, so that excellent transistor performance cannot be displayed. To avoid such an inconvenience more effectively, the carrier density is preferably set to $10^{+16}$ $cm^{-3}$ or less, more preferably, $10^{+15}$ $cm^{-3}$ or less and, particularly preferably, $10^{+14}$ $cm^{-3}$ or less.

When the Hall mobility is smaller than 2 $cm^2/Vs$, the field effect mobility of the thin film transistor 1 becomes low. In the case of using the device as a switching device for driving a display device, there is the possibility that, in a manner similar to amorphous silicon, switching speed is low and the device cannot follow high-speed display of a moving picture. To avoid such an inconvenience more effectively, a Hall mobility is preferably set to 5 $cm^2/Vs$ or higher, more preferably, 8 $cm^2/Vs$ or higher, further more preferably, 11 $cm^2/Vs$ or higher and, particularly preferably, 14 $cm^2/Vs$ or higher.

By forming the transparent semiconductor thin film 40 having a carrier density of $10^{+17}$ $cm^{-3}$ or less and a Hall mobility of 2 $cm^2/Vs$ or more, a novel excellent field effect transistor can be obtained. The transistor has a high field effect mobility and a high on-off ratio, is normally off, has a clear pinch-off, can realize a larger area, and is replacing a conventional field effect transistor using amorphous silicon.

If the energy band gap is smaller than 2.4 eV, when a visible ray is emitted, electrons in the valence band are excited, conductivity is displayed, and there is the possibility that a leak current is generated easily. To avoid such an inconvenience more effectively, the energy band gap is preferably 2.6 eV or larger, more preferably 2.8 eV or larger, further more preferably 3.0 eV or larger, and particularly preferably 3.2 eV or larger.

The specific resistance of the transparent semiconductor thin film 40 is usually $10^{-1}$ to $10^{+8}$ $\Omega cm$, preferably $10^{-1}$ to $10^{+8}$ $\Omega cm$, more preferably, $10^0$ to $10^{+6}$ $\Omega m$, further more preferably $10^{+1}$ to $10^{+4}$ $\Omega cm$ and, particularly preferably $10^{+2}$ to $10^{+3}$ $\Omega cm$.

By making indium oxide contained in the transparent semiconductor thin film 40, the high Hall mobility is realized. By controlling oxygen partial pressure in the atmospheric gas at the time of film formation or the content of the water $H_2O$ or hydrogen $H_2$ in the atmospheric gas, the Hall mobility can be controlled.

The reason why it is effective to make zinc oxide contained together with indium oxide is assumed that, by substituting it with a positive trivalent indium site in crystallization, carriers are trapped, and the carrier density is lowered by hardly decreasing the Hall mobility.

By making zinc as a positive divalent element contained in indium as a positive trivalent element, the carrier concentration is lowered. In addition, by performing an oxidizing process after film formation as will be described later, the carrier concentration can be also controlled without lowering the Hall mobility.

The atom ratio [Zn/(Zn+In)] between indium [In] and zinc [Zn] contained in the semiconductor thin film 50 can be set in the range of 0.10 to 0.82.

When the atom ratio [Zn/(Zn+In)] is lower than 0.10 and the content of zinc is small, crystallization easily occurs. There is the possibility that, if proper manufacture conditions are not chosen, a uniform amorphous film cannot be obtained in a large area.

On the other hand, when the atom ratio [X/(X+In)] becomes higher than 0.82 and the content of zinc becomes excessive, there is the possibility that chemical resistance decreases, crystal of zinc oxide is generated, and the film quality becomes nonuniform.

In the embodiment, to avoid the inconvenience more effectively, the atom ratio [X/(X+In)] is preferably 0.51 to 0.80, more preferably 0.55 to 0.80, and particularly preferably 0.6 to 0.75.

In the transparent semiconductor thin film 40, preferably, the transmittance of wavelength 550 nm is 75% or higher. If the transmittance of wavelength 550 nm is lower than 75%, when the semiconductor thin film lies off to the pixel electrode part, the transmittance decreases. There is the possibility that luminance deteriorates or hue changes. To avoid such an inconvenience more effectively, the transmittance of wavelength 550 nm is preferably 80% or higher and, particularly preferably, 85% or higher.

In the transparent semiconductor thin film 40, preferably, the work function is 3.5 to 6.5 eV. When the work function is smaller than 3.5 eV, there is the possibility that the transistor characteristics deteriorate such as occurrence of charge injection or the like in the interface with the gate insulating film or generation of a leak current. On the other hand, when the work function is larger than 6.5 eV, there is the possibility that the transistor characteristics deteriorate such as occurrence of an energy barrier or the like in the interface with the gate insulating film or deterioration in the pinch-off characteristic. To avoid such an inconvenience more effectively, the work function is preferably 3.8 to 6.2 eV, more preferably 4.0 to 6.0 eV, further more preferably 4.3 to 5.7 eV, and particularly preferably 4.5 to 5.5 eV.

The transparent semiconductor thin film 40 is preferably a non-degenerate semiconductor thin film. When the transparent semiconductor thin film 40 is a degenerate semiconductor, the carrier concentration may not be controlled stably to be low.

The non-degenerate semiconductor thin film denotes a semiconductor thin film in which the carrier concentration changes depending on temperature. In contrast, the degenerate semiconductor thin film denotes a semiconductor thin film in which the carrier concentration expresses a constant value without depending on the temperature. The temperature dependency of the carrier concentration can be obtained from Hall measurement.

In the transparent semiconductor thin film 40, preferably, nanocrystals are dispersed in an amorphous film. When nanocrystals are dispersed in an amorphous film, it is preferable for the reasons that the Hall mobility improves, the field effect mobility becomes higher, and the transistor characteristics improve. The presence of nanocrystals can be confirmed by observation with a TEM.

In the transparent semiconductor thin film 40, a third metallic element other than indium oxide and zinc oxide and a compound of the third metallic element may be contained without deteriorating the effects of the embodiment.

In this case, the atom ratio [M/(M+In)] between indium [In] and the third metallic element [M] is set to 0 to 0.5. When the atom ratio [M/(M+In)] exceeds 0.5, the Hall mobility may decrease. The reason is estimated that the number of bonds between main elements decreases and it makes percolation conduction difficult.

To avoid such an inconvenience more effectively, the atom ratio [M/(M+In)] is preferably 0 to 0.3.

In the transparent semiconductor thin film 40, when a maximum value of a radial distribution function (RDF) obtained by X-ray scatter measurement in an atomic distance of 0.3 to 0.36 nm is A and a maximum value of the RDF in an atomic distance of 0.36 to 0.42 nm is B, preferably, relation A/B>0.8 is satisfied.

It is estimated that the ratio (A/B) is a ratio between edge sharing and corner sharing in a binding form of indium-oxygen-indium or a maintenance ratio of a short distance order. When the ratio (A/B) is 0.8 or less, the Hall mobility and the field effect mobility may decrease.

To avoid such an inconvenience more effectively, the ratio (A/B) satisfies, more preferably, A/B>0.9, further more preferably, A/B>1.0, and the most preferably, A/B>1.1. It is estimated that when the ratio (A/B) is high, the short distance order between indium and indium of short distances is maintained. Consequently, the electron movement path is assured, and improvement in the Hall mobility and the field effect mobility is expected.

In the embodiment, the film forming method for forming the transparent semiconductor thin film 40 is not limited to the chemical film forming method such as the spray coating method, the dipping method, or CVD method but the physical film forming method can be also used. From the viewpoint of easiness of control on the carrier density and improvement in the film quality, the physical film forming method is preferred.

As the physical film forming method, for example, sputtering, vacuum deposition, ion plating, pulse laser deposition, and the like can be mentioned. From the industrial viewpoint, sputtering realizing high mass productivity is preferable.

As the sputtering, for example, DC sputtering, RF sputtering, AC sputtering, ECR sputtering, facing target sputtering, and the like can be mentioned. Among them, DC sputtering and AC sputtering realizing high mass productivity and the carrier concentration lower than the RF sputtering are preferred from the industrial viewpoint. To suppress degradation in the interface caused by film formation and leak current and to improve the characteristics of the transparent semiconductor thin film 40 such as on-off ratio, ECR sputtering and facing target sputtering in which the film quality can be easily controlled are preferred.

In the case of using sputtering, a sintered target containing indium oxide and zinc oxide may be used or both a sintered target containing indium oxide and a sintered target containing zinc oxide may be used. Reactive sputtering may be performed on a metal target made of indium or zinc or an alloy target while introducing gas such as oxygen.

From viewpoint of reproducibility and uniformity in a large area, it is preferable to use a sintered target containing an indium oxide and an oxide of a positive divalent element.

In the case of using sputtering, the partial pressure of water $H_2O$ contained in the atmospheric gas is set to $10^{-3}$ Pa or less. When the partial pressure of water $H_2O$ is higher than $10^{-3}$ Pa, there is the possibility that the Hall mobility decreases. The reason is estimated that hydrogen binds to indium or oxygen in a bixbite structure to make edge sharing parts of the oxygen-indium bond corner-shared. To avoid such an inconvenience more effectively, the partial pressure of $H_2O$ is preferably $8\times10^{-4}$ Pa or less, more preferably $6\times10^{-4}$ Pa or less, further more preferably $4\times10^{-4}$ or less, and particularly preferably $2\times10^{-4}$ Pa or less.

The partial pressure of hydrogen $H_2$ in the atmospheric gas is usually $10^{-2}$ Pa or less, preferably $5\times10^{-3}$ Pa or less, more preferably $10^{-3}$ Pa or less, further more preferably $5\times10^{-4}$ or less, and particularly preferably $2\times10^{-4}$ Pa or less. When $H_2$ exists in the atmospheric gas, the carrier concentration increases and, moreover, the Hall mobility may decrease.

The partial pressure of oxygen $O_2$ in the atmospheric gas is normally set to $40\times10^{-3}$ Pa or less. When the oxygen partial pressure in the atmospheric gas is higher than $40\times10^{-3}$ Pa, there is the possibility that the Hall mobility decreases, or the Hall mobility or carrier concentration becomes unstable. The reason is estimated as follows. When oxygen in the atmospheric gas is excessive at the time of film formation, oxygen taken in the crystal lattice increases, and it causes scattering. The oxygen easily leaves the film, and unstableness occurs.

To avoid such inconveniences more effectively, the oxygen partial pressure in the atmospheric gas is preferably $15\times10^{-3}$ Pa or less, more preferably $7\times10^{-3}$ Pa or less, and particularly preferably $1\times10^{-3}$ Pa or less.

Ultimate pressure is usually set to $10^{-5}$ Pa or less. When the ultimate pressure is higher than $10^{-5}$ Pa, there is the possibility that the partial pressure of water $H_2O$ increases and cannot be set to $10^{-3}$ Pa or less. To avoid such an inconvenience more effectively, the ultimate pressure is preferably $5\times10^{-6}$ Pa or less and, particularly preferably, $10^{-6}$ Pa or less.

In the case of forming a film of a large area by sputtering, to provide uniformity in film quality, it is preferable to take a method of rotating a folder to which the substrate is fixed, moving a magnet to widen an erosion range, or the like.

In such a film forming process, normally, a film is physically formed at a substrate temperature of 200° C. or less. After completion of the film forming process, by performing an oxidizing process on the thin film containing indium oxide and zinc oxide, the carrier concentration in the transparent semiconductor thin film 40 can be controlled.

When the substrate temperature at the time of film formation is higher than 200° C., the carrier concentration may not decrease though the oxidizing process is performed or, in the case of using a substrate made of resin, deformation or a change in dimensions may occur. To avoid such an inconvenience more effectively, the substrate temperature is preferably 180° C. or less, more preferably 150° C. or less, further more preferably 120° C. or less, and particularly preferably 90° C. or less.

After completion of such a film forming process, in the embodiment, by performing an oxidizing process on the thin film containing indium oxide and zinc oxide, the carrier concentration in the transparent semiconductor thin film 40 can be controlled.

There is also a method of controlling the carrier concentration by controlling concentration of gas components such as oxygen at the time of film formation. In such a method, the Hall mobility may deteriorate. The reason is estimated that the gas components introduced for carrier control are taken in the film and become scattering factors.

As the oxidizing process, heat treatment is performed normally in the presence of oxygen under conditions of 80 to 650° C. and 0.5 to 12000 minutes.

When the temperature of the heat treatment is lower than 80° C., the process effects do not appear or it may take too much time. When the temperature is higher than 650° C., there is the possibility that the substrate deforms. To avoid such an inconvenience more effectively, the process temperature is preferably 120 to 500° C., more preferably, 150 to 450° C., further more preferably, 180 to 350° C., and, particularly preferably, 200 to 300° C.

When the time of the heat treatment is shorter than 0.5 minute, time to heat to the inside is insufficient, and the heat treatment may not be performed sufficiently. When the time is longer than 12000 minutes, the processing apparatus becomes large and may not be suitable for an industrial application. There is the possibility that the substrate is broken or deformed during the treatment. To avoid such an inconvenience more effectively, the process time is preferably 1 to 600 minutes, more preferably 5 to 360 minutes, further more preferably 15 to 240 minutes, and particularly preferably 30 to 120 minutes.

As the oxidizing process, heat treatment can be performed in the presence of oxygen by a lamp annealer (LA), a rapid thermal annealer (RTA), or a laser annealer. As the oxidizing process, an ozone process can be also applied.

EXAMPLES

By using concrete examples, the present invention will be described in more detail below.

First Example (1) Manufacture and Evaluation of Sputtering Target
1. Manufacture of Target As materials, indium oxide having an average particle diameter of 3.4 μm and zinc oxide having an average particle diameter of 0.6 μm were mixed so that the atom ratio [In/(In+Zn)] becomes 0.28 and the atom ratio [Zn/(In+Zn)] becomes 0.72. The mixture was supplied to a wet ball mill and mixed and ground for 72 hours to obtain material fine powders.

The obtained material fine powders were granulated and, after that, pressed to a shape having a diameter of 10 cm and a thickness of 5 mm. The resultant was put in a firing furnace and sintered under conditions of 1,400° C. and 48 hours under pressure of oxygen gas, thereby obtaining a sintered body (target). The rate of temperature rise was 3° C./minute.

2. Evaluation of Target

The density and a bulk resistance value of the obtained target were measured. As a result, theoretical relative density was 99% and the bulk resistance value measured by a four-probe method was 0.8 mΩ.

(2) Formation of Transparent Semiconductor Thin Film

The sputtering target obtained in (1) was loaded to a film forming apparatus using the DC magnetron sputtering method as one of the DC sputtering methods and a transparent conductive film was formed on a glass substrate (corning 1737).

Sputtering conditions were substrate temperature of 25° C., ultimate pressure of $1\times10^{-3}$ Pa, atmospheric gas Ar of 100%, sputtering pressure (total pressure) of $4\times10^{-1}$ Pa, input power of 100 W, and film formation time of 20 minutes.

As a result, a transparent conductive glass in which a transparent conductive oxide having a film thickness of about 100 nm is formed was obtained on the glass substrate.

The film composition obtained was analyzed by ICP method and found that the atom ratio [In/(In+Zn)] was 0.28 and the atom ratio [Zn/(In+Zn)] was 0.72.

(3) Process of Oxidizing Transparent Semiconductor Thin Film

An oxidizing process was performed by heating the transparent semiconductor thin film obtained in (2) in the atmosphere (in the presence of oxygen) at 150° C. for 100 hours (atmosphere heat treatment).

(4) Evaluation on Properties of Transparent Semiconductor Thin Film

The carrier concentration and Hall mobility of the transparent semiconductor thin film obtained in (3) were measured by a Hall measuring apparatus. The carrier concentration was $2\times10^{15}$ cm$^{-3}$ and the Hall mobility was 16 cm$^2$/Vs. The specific resistance value measured by the four terminal method was 200 Ωcm.

It was confirmed by X-ray diffraction that the obtained film was an amorphous film.

The Hall measuring apparatus and measurement conditions were as follows.

[Hall Measuring Apparatus]
Resi Test8310 (manufactured by TOYO Corporation)

[Measurement Conditions]
Room temperature (25° C.), 0.5[T], and AC magnetic field Hall measurement Further, light transmittance of the transparent conductive oxide with respect to a light beam having a wavelength of 550 nm measured by a spectro-photometer was 85% and excellent. The energy band gap was 3.3 eV and sufficiently large.

Examples 2 to 7 and Comparative Examples 1 to 4

Transparent semiconductor thin films were manufactured and evaluated in a manner similar to the example 1 except that the composition ratio of materials, film forming conditions, and oxidizing process conditions were adjusted as shown in Table 1.

TABLE 1

| | | Examples | | | | | |
|---|---|---|---|---|---|---|---|
| | | 1 | 2 | 3 | 4 | 5 | 6 |
| Film forming method | | DC magnetron sputtering | RF magnetron sputtering | DC magnetron sputtering | DC magnetron sputtering | DC magnetron sputtering | DC magnetron sputtering |
| Film forming parameters | Substrate temperature [° C.] | 25 | 25 | 25 | 25 | 25 | 25 |
| | Ultimate pressure [×10$^{-4}$ Pa] | 10 | 10 | 10 | 10 | 10 | 10 |
| | Atmospheric gas | Ar: 100% | Ar: 100% | Ar: 100% | Ar: 98.5% O$_2$: 1.5% | Ar: 100% | Ar: 100% |
| | Total pressure [Pa] | 0.4 | 0.4 | 0.4 | 0.4 | 0.4 | 0.4 |
| | Oxygen partial pressure [×10$^{-3}$ Pa] | 0 | 0 | 0 | 6 | 0 | 0 |
| Film composition Atom ratio | In/(In + Zn) | 0.28 | 0.28 | 0.28 | 0.28 | 0.37 | 0.47 |
| | Zn/(In + Zn) | 0.72 | 0.72 | 0.72 | 0.72 | 0.63 | 0.53 |
| | Ga/(In + Zn + Ga) | | | | | | |
| X-ray scatter measurement | Ratio of maximum value of RDF A/B | 1.20 | 1.20 | 1.20 | 0.95 | 1.20 | 1.20 |
| Oxidizing process | | Heat treatment in Atmosphere 280° C. 2 hours | Heat treatment in Atmosphere 150° C. 100 hours | Ozone process | Ozone process | Heat treatment in Atmosphere 280° C. 2 hours | Heat treatment in Atmosphere 280° C. 2 hours |
| Characteristics of semiconductor thin film | Crystal property (X-ray diffraction) | amorphous | amorphous | amorphous | amorphous | amorphous | amorphous |
| | Hall measurement Carrier density [cm$^{-3}$] | $2 \times 10^{15}$ | $8 \times 10^{15}$ | $6 \times 10^{15}$ | $6 \times 10^{15}$ | $8 \times 10^{15}$ | $9 \times 10^{15}$ |
| | Hall mobility [cm$^2$/Vs] | 16 | 12 | 13 | 6 | 24 | 26 |
| | Specific resistance (four-terminal method) [Ωcm] | 200 | 80 | 80 | 160 | 75 | 73 |
| | Energy band gap (eV) | 3.3 | 3.3 | 3.3 | 3.3 | 3.3 | 3.3 |
| Top gate TFT characteristic | characteristic | excellent | excellent | excellent | excellent | excellent | excellent |
| | On-off ratio | 10$^6$ or higher | 10$^6$ or higher | 10$^6$ or higher | 10$^5$ | 10$^6$ or higher | 10$^6$ or higher |

| | | Examples | Comparative examples | | | |
|---|---|---|---|---|---|---|
| | | 7 | 1 | 2 | 3 | 4 |
| Film forming method | | DC magnetron sputtering | DC magnetron sputtering | DC magnetron sputtering | DC magnetron sputtering | RF magnetron sputtering |
| Film forming parameters | Substrate temperature [° C.] | 25 | 25 | 25 | 25 | 25 |
| | Ultimate pressure [×10$^{-4}$ Pa] | 10 | 10 | 10 | 10 | 10 |
| | Atmospheric gas | Ar: 99% H$_2$: 1% | Ar: 100% | Ar: 100% | Ar: 100% | Ar: 100% |
| | Total pressure [Pa] | 0.4 | 0.4 | 0.4 | 0.4 | 0.4 |
| | Oxygen partial pressure [×10$^{-3}$ Pa] | 0 | 0 | 0 | 0 | 20 |
| Film composition Atom ratio | In/(In + Zn) | 0.47 | 1.00 | 0.00 | 0.28 | 0.55 |
| | Zn/(In + Zn) | 0.53 | 0.00 | 1.00 | 0.72 | 0.45 |
| | Ga/(In + Zn + Ga) | | | | | 0.35 |
| X-ray scatter measurement | Ratio of maximum value of RDF A/B | 0.95 | | | 1.05 | 0.75 |
| Oxidizing process | | Heat treatment in Atmosphere 280° C. 2 hours | Heat treatment in Atmosphere 280° C. 2 hours | Heat treatment in Atmosphere 280° C. 2 hours | none | none |

TABLE 1-continued

| Characteristics of semiconductor thin film | Crystal property (X-ray diffraction) | | amorphous | Polycrystal | Polycrystal | amorphous | Amorphous |
|---|---|---|---|---|---|---|---|
| | Hall measurement | Carrier density [cm$^{-3}$] | $1.2 \times 10^{16}$ | $2 \times 10^{18}$ | $2 \times 10^{17}$ | $1.1 \times 10^{19}$ | $9 \times 10^{17}$ |
| | | Hall mobility [cm$^2$/Vs] | 8 | 28 | 8 | 24 | 1 |
| | | Specific resistance (four-terminal method) [Ωcm] | 12 | 0.1 | 60 | 0.4 | 0.4 |
| | | Energy band gap (eV) | 3.3 | 3.1 | 3.4 | 3.3 | 3.3 |
| Top gate TFT characteristic | characteristic | | good | poor | poor | poor | poor |
| | On-off ratio | | $10^5$ | $10^3$ | $10^4$ | $10^3$ | $10^4$ |

Thin film transistors were manufactured and evaluated as follows using the semiconductor thin films of the examples and the comparative examples.

[Top-Gate-Type Transparent Thin Film Transistor]

Using transparent semiconductor thin film having 30 nm formed under the same conditions as those of the examples 1 to 7 and the comparative examples 1 to 4 except for the film formation time on a PET substrate, top-gate-type thin film transistors each having a channel length L=10 μm and a channel width W=150 μm and having a configuration as shown in FIG. 1 were constructed.

As the gate insulating film, yttrium oxide having high dielectric constant was stacked to a thickness of 170 nm. IZO having a thickness of 150 nm was used as each of a gate electrode, a source electrode, and a drain electrode.

The thin film transistors obtained were evaluated with the following evaluation criteria. The results are shown together with the on-off ratio in Table 1.

[Evaluation Criteria]

Very excellent: A hysteresis in the I-V characteristic is small even when the operation is repeated ten times or more.

Excellent: A large hysteresis occurs in the I-V characteristic when the operation is repeated ten times or more.

Poor: A large hysteresis occurs in the I-V characteristic when the operation is repeated less than 10 times.

The present invention has been described by the preferred embodiments. Obviously, the invention is not limited to the foregoing embodiments and can be variously modified in the scope of the invention.

For example, the thin film transistor has been described in the foregoing embodiments. However, the semiconductor thin film according to the invention can be applied to various field effect transistors.

INDUSTRIAL APPLICABILITY

The semiconductor thin film in the present invention can be widely used as a semiconductor thin film used for a field effect transistor such as a thin film transistor.

The invention claimed is:

1. A semiconductor thin film comprising: an amorphous film containing zinc oxide, and indium oxide, said amorphous film having a carrier density of $10^{+17}$ cm$^{-3}$ or less, a Hall mobility of 2 cm$^2$/V·sec or higher, and an energy band gap of 2.4 eV or more, and wherein the atom ratio between zinc [Zn] and indium [In] in said amorphous film, expressed as Zn/(Zn+In), is 0.51 to 0.80.

2. The semiconductor thin film according to claim 1, wherein said semiconductor thin film is a non-degenerate semiconductor thin film having a work function of 3.5 to 6.5 eV.

3. The semiconductor thin film according to claim 1, wherein a maximum value of a radial distribution function (RDF) obtained by X-ray scatter measurement in an atomic distance of 0.3 to 0.36 nm is A, and a maximum value of the RDF in an atomic distance of 0.36 to 0.42 nm is B, and wherein the ratio of relation A/B is >0.8.

4. The semiconductor thin film according to claim 1, wherein the transmittance of wavelength of 550 nm of said semiconductor thin film is 75% or higher.

5. The transparent oxide semiconductor thin film according to claim 2, wherein the work function is 3.8 to 6.2 eV.

6. The semiconductor thin film according to claim 1, wherein nanocrystals are dispersed in said amorphous film.

7. The semiconductor thin film according to claim 1, wherein said amorphous film further contains a third metallic element [M], wherein atom ratio [M/(M+In)] between said third metallic element [M] and indium [In] is 0 to 0.5.

8. The semiconductor thin film according to claim 1, wherein said amorphous film further contains a third metallic element [M], wherein atom ratio [M/(M+In)] between said third metallic element [M] and indium [In] is 0 to 0.3.

9. The transparent oxide semiconductor thin film according to claim 3, wherein the ratio A/B is >0.9.

10. A method for manufacturing a semiconductor thin film according to claim 1, said method comprising:
forming said amorphous film containing zinc oxide and indium oxide under a partial pressure of water H$_2$O in an atmospheric gas of 10$^{-3}$ Pa or less.

11. The method for manufacturing a semiconductor thin film according to claim 10, further comprising oxidizing said amorphous film physically formed at a substrate temperature of 200° C. or less.

12. A thin film transistor comprising the semiconductor thin film according to claim 1.

13. The thin film transistor according to claim 12, wherein the semiconductor thin film is provided on a resin substrate.

14. An active-matrix-driven display panel comprising the thin film transistor according to claim 12.

15. The transparent oxide semiconductor thin film according to claim 1, wherein the carrier density is $10^{+16}$ cm$^{-3}$ or less, the Hall mobility is 5 cm$^2$/Vs or higher, and the energy band gap is 2.6 eV or larger.

16. The transparent oxide semiconductor thin film according to claim 1, wherein the specific resistance is $10^{-1}$ to $10^{+8}$ Ωcm.

17. The transparent oxide semiconductor thin film according to claim 1, wherein the atom ratio [Zn/(Zn+In)] is 0.55 to 0.80.

18. The semiconductor thin film according to claim 1, wherein the transmittance of wavelength of 550 nm of said semiconductor thin film is 80% or higher.

* * * * *